US009165661B2

(12) United States Patent
Amonkar et al.

(10) Patent No.: US 9,165,661 B2
(45) Date of Patent: Oct. 20, 2015

(54) SYSTEMS AND METHODS FOR SWITCHING BETWEEN VOLTAGES

(75) Inventors: Ashish A. Amonkar, Santa Clara, CA (US); Leonard Gitlan, Colorado Springs, CO (US)

(73) Assignee: Cypress Semiconductor Corporation, San Jose, CA (US)

( * ) Notice: Subject to any disclaimer, the term of this patent is extended or adjusted under 35 U.S.C. 154(b) by 809 days.

(21) Appl. No.: 13/430,348

(22) Filed: Mar. 26, 2012

(65) Prior Publication Data

US 2013/0249314 A1 Sep. 26, 2013

Related U.S. Application Data

(60) Provisional application No. 61/599,554, filed on Feb. 16, 2012.

(51) Int. Cl.
*H02J 1/00* (2006.01)
*H03K 17/00* (2006.01)
*H03K 19/094* (2006.01)
*G11C 16/12* (2006.01)
*H03K 17/693* (2006.01)

(52) U.S. Cl.
CPC .............. *G11C 16/12* (2013.01); *H03K 17/693* (2013.01); *H03K 2217/0054* (2013.01); *Y10T 307/747* (2015.04)

(58) Field of Classification Search
USPC ................. 307/85; 327/407, 408, 99; 326/113
See application file for complete search history.

(56) References Cited

U.S. PATENT DOCUMENTS

| 5,493,486 A | 2/1996 | Connell et al. |
| 5,973,979 A | 10/1999 | Chang et al. |
| 6,198,342 B1 | 3/2001 | Kawai |

(Continued)

FOREIGN PATENT DOCUMENTS

| WO | 03088494 A | 10/2003 |
| WO | 2009014693 A | 1/2009 |
| WO | 2012003581 A | 1/2012 |

OTHER PUBLICATIONS

Hoi Lee and Philip K. T. Mok_Switching Noise and Shoot-Through Current Reduction Techniques for Switched-Capacitor Voltage Doubler_May 5, 2005_11 pages.

(Continued)

*Primary Examiner* — Rexford Barnie
*Assistant Examiner* — Dru Parries

(57) ABSTRACT

Systems and methods for switching between voltages are provided. One system includes an output, first and second switches coupled to the output. The system also includes a first transmission gate coupled to the first switch and a second transmission gate coupled to the second switch. One method includes receiving, at the first transmission gate, a first pair of complementary voltages and receiving, at the second transmission gate, a second pair of complementary voltages. The method further includes selecting the smallest voltage amongst both pairs of complementary voltages and outputting a third pair of complementary voltages. In one method, the first pair of complementary voltages includes a first negative voltage and a positive voltage, the second pair of complementary voltages includes a second negative voltage and the positive voltage, and the third pair of complementary voltages includes the smaller of the first and second negative voltages and the positive voltage.

20 Claims, 4 Drawing Sheets

(56) References Cited

U.S. PATENT DOCUMENTS

| | | |
|---|---|---|
| 6,359,798 B1 | 3/2002 | Han et al. |
| 6,532,178 B2 | 3/2003 | Taub |
| 7,570,466 B2 | 8/2009 | Chu |
| 2007/0242520 A1 | 10/2007 | Chiavetta |
| 2010/0127753 A1 | 5/2010 | Shim |
| 2011/0096602 A1 | 4/2011 | Kim et al. |
| 2011/0260780 A1 | 10/2011 | Granger-Jones et al. |

OTHER PUBLICATIONS

Hoi Lee and Philip K. T. Mok_Switching Noise Reduction Techniques for Switched-Capcitor Voltage Doubler_Dated 2003_4 pages.

Mahdi Abhari and Adib Abrshamifar_A Novel Ultra Low-Leakage Switch for Switched Capacitor Circuits_4 pages, Dated 2009.

Search Report for U.S. Appl. No. 13/430,348, Dated Mar. 2012, 12 pages.

SIPO Office Action for Application No. 201210323627.1 dated Aug. 16, 2015; 4 pages.

SYSTEMS AND METHODS FOR SWITCHING BETWEEN VOLTAGES

This application claims priority to U.S Provisional Patent Application No. 61/599,554, filed Feb. 16, 2012, which is incorporated herein by reference in its entirety.

BACKGROUND

1. Field

Various embodiments relate to electronic circuits and, particularly, to systems and methods for switching between voltages.

2. Description of the Related Art

Some memory systems utilize multiple voltages during operation that are typically produced by voltage pumps. Specifically, these memory systems utilize a first voltage pump to produce a high voltage during program and erase operations and a second voltage pump to produce a lower voltage during read operations. That is, during program/erase operations the first voltage pump is producing the high voltage and the second voltage pump is OFF (i.e., 0 volts). Conversely, during read operations the second voltage pump is producing the lower voltage and the first voltage pump is OFF (i.e., 0 volts).

When the first voltage pump and/or the second voltage pump are each respectively OFF, the memory systems experience a significant amount of leakage current. To overcome the issues associated with the leakage current, the size of the voltage pumps are increased, which increases the area of the die.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict only typical embodiments of the invention and are not therefore to be considered to be limiting of its scope, the invention will be described and explained with additional specificity and detail through the use of the accompanying drawings, in which.

DETAILED DESCRIPTION OF THE DRAWINGS

Figure 1:
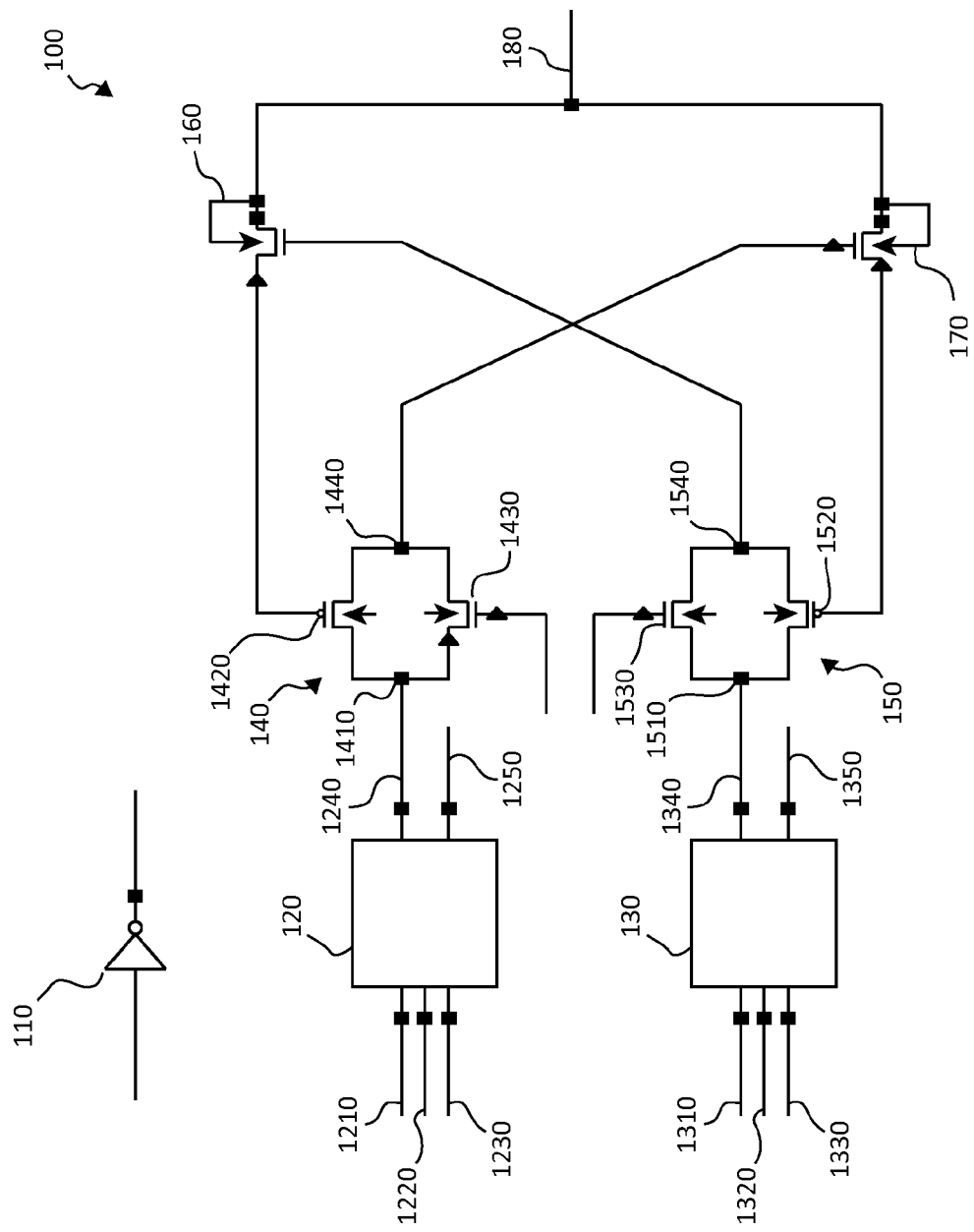
FIG. 1 is a schematic diagram of one embodiment of a circuit for switching between voltages.

Reference in the description to "one embodiment" or "an embodiment" means that a particular feature, structure, or characteristic described in connection with the embodiment is included in at least one embodiment of the invention. The phrase "in one embodiment" located in various places in this description does not necessarily refer to the same embodiment.

In the following detailed description, for purposes of explanation, numerous specific details are set forth in order to provide a thorough understanding of the subject matter of the present application. It will be evident, however, to one skilled in the art that the disclosed embodiments, the claimed subject matter, and their equivalents may be practiced without these specific details.

The detailed description includes references to the accompanying drawings, which form a part of the detailed description. The drawings show illustrations in accordance with example embodiments. These embodiments, which may also be referred to herein as "examples," are described in enough detail to enable those skilled in the art to practice the embodiments of the claimed subject matter described herein. The embodiments may be combined, other embodiments may be utilized, or structural, logical, and electrical changes may be made without departing from the scope and spirit of the claimed subject matter. It should be understood that the embodiments described herein are not intended to limit the scope of the subject matter but rather to enable one skilled in the art to practice, make, and/or use the subject matter.

The various embodiments described herein include systems for switching between a plurality of voltages. One system comprises an output, a first switch coupled to the output, and a second switch coupled to the output. The system further comprises a first controlled transmission gate coupled to the first switch and configured to be coupled to a first voltage source and a second controlled transmission gate coupled to the second switch and configured to be coupled to a second voltage source.

Apparatus for switching between a plurality of voltages are also provided. One apparatus comprises a first level shifter configured to output a first pair complementary voltages and a second level shifter configured to output a second pair complementary voltages. The apparatus further comprises a first transmission gate coupled to the first level shifter and configured to receive the first pair of complementary voltages and output a first voltage, and a second transmission gate coupled to the second level shifter and configured to receive the second pair of complementary voltages and output a second voltage. In this embodiment, the first voltage and the second voltage comprise a third pair of complementary voltages output by the apparatus.

Various other embodiments provide methods for switching between a plurality of voltages. One method comprises receiving, at a first transmission gate, a first pair of complementary voltages and receiving, at a second transmission gate, a second pair of complementary voltages. The method further comprises selecting the smallest voltage amongst both pairs of complementary voltages and outputting a third pair of complementary voltages comprising the smallest voltage.

Turning now to the figures, FIG. 1 is a block diagram of one embodiment of a circuit 100 for switching between a plurality of voltages. At least in the illustrated embodiment, circuit 100 comprises an inverter 110 coupled to a level shifter 120 and a level shifter 130, a transmission gate 140 coupled to level shifter 120, a transmission gate 150 coupled to level shifter 130, a switch 160 coupled to level shifter 120 and level shifter 130, a switch 170 coupled to level shifter 120 and level shifter 130, and an output 180 coupled to switch 160 and switch 170.

Inverter 110 may be any inverting device known in the art or developed in the future. That is, inverter 110 may be system and/or device capable of receiving a signal and outputting an inverted signal. For example, when inverter 110 receives a logic 0 signal, inverter 110 outputs a logic 1 signal. Similarly, when inverter 110 receives a logic 1 signal, inverter 110 outputs a logic 0 signal. The output of inverter 110 is configured to transmit the output signal to level shifter 120 and level shifter 130.

Level shifter 120 includes an input 1210 coupled to the output of inverter 110. Level shifter 120 also includes an input 1220 coupled to the input of inverter 110 and an input 1230 coupled to a negative voltage Vbb.

Vpwr, in various embodiments, is a positive voltage in the range of about 1.6 volts to about 1.95 volts. In one embodiment, Vpwr includes a voltage of about 1.8 volts.

Vbb, in various embodiments, is a negative voltage in the range of about −2.2 volts to about −1.0 volts. In one embodiment, Vbb includes a voltage of about −1.8 volts.

Level shifter 120 further comprises an output 1240 and an output 1250. Level shifter 120 is configured to output Vbb via output 1240 and output Vpwr via output 1250 when level shifter 120 receives a logic 1 signal from inverter 110. Furthermore, level shifter 120 is configured to output Vpwr via output 1240 and output Vbb via output 1250 when level shifter 120 receives a logic 0 signal from inverter 110. Accordingly, outputs 1240 and 1250 are complementary outputs. The complementary output 1240 and 1250 are both provided to transmission gate 140.

Level shifter 130 includes an input 1310 coupled to the input of inverter 110 and an input 1320 coupled to the output of inverter 110. Level shifter 130 also includes an input 1330 coupled to a negative voltage Vneg.

Vneg, in various embodiments, is a negative voltage in the range of about −4.5 volts to about −3.0 volts. In one embodiment, Vneg includes a voltage of about −4.0 volts.

Level shifter 130 further comprises an output 1340 and an output 1350. Level shifter 130 is configured to output Vpwr via output 1340 and output Vneg via output 1350 when level shifter 130 receives a logic 1 signal from inverter 110. Furthermore, level shifter 130 is configured to output Vneg via output 1340 and output Vpwr via output 1350 when level shifter 130 receives a logic 0 signal from inverter 110. Accordingly, outputs 1340 and 1350 are complementary outputs. The complementary output 1340 and 1350 are both provided to transmission gate 150.

Transmission gate 140 comprises an input node 1410 coupled to output 1240, a switch 1420 coupled to input node 1410, a switch 1430 coupled to input node 1410 and to output 1250, and an output node 1440 coupled to switch 1420 and switch 1430.

In one embodiment, switch 1420 comprises a high voltage P-channel metal oxide semiconductor field-effect transistor (pMOSFET) including a source, a drain, and a gate. In this embodiment, the source of switch 1420 is coupled to node 1410, the drain of switch 1420 is coupled to node 1440, and the gate of switch 1420 is coupled to a switch 160, which is coupled to Vbb.

Switch 1430, in one embodiment, comprises a high voltage N-channel metal oxide semiconductor field-effect transistor (nMOSFET) including a source, a drain, and a gate. In this embodiment, the source of switch 1430 is coupled to node 1410, the drain of switch 1430 is coupled to node 1440, and the gate of switch 1430 is coupled to output 1250.

Transmission gate 150 comprises an input node 1510 coupled to output 1340, a switch 1520 coupled to input node 1510, a switch 1530 coupled to input node 1510 and to output 1350, and an output node 1540 coupled to switch 1520 and switch 1530.

In one embodiment, switch 1520 comprises a high voltage pMOSFET including a source, a drain, and a gate. In this embodiment, the source of switch 1520 is coupled to node 1510, the drain of switch 1520 is coupled to node 1540, and the gate of switch 1520 is coupled to a switch 170, which is coupled to Vneg.

Switch 1530, in one embodiment, comprises a high voltage nMOSFET including a source, a drain, and a gate. In this embodiment, the source of switch 1530 is coupled to node 1510, the drain of switch 1530 is coupled to node 1540, and the gate of switch 1530 is coupled to output 1350.

Switch 160, in one embodiment, comprises a high voltage nMOSFET including a drain, a gate, and a source. In this embodiment, the drain of switch 160 is coupled to the gate of switch 1420, the gate of switch 160 is coupled to output 1540, and the source of switch 160 is coupled to an output 180.

Switch 170, in one embodiment, comprises a high voltage nMOSFET including a drain, a gate, and a source. In this embodiment, the drain of switch 170 is coupled to the gate of switch 1520, the gate of switch 170 is coupled to output 1440, and the source of switch 170 is coupled to output 180.

Notably, switches 170 and 160 are cross-coupled to transmission gates 140 and 150. Furthermore, output nodes 1440 and 1540 are complementary outputs, which complementary output voltages are provided to switches 160 and 170.

The following examples of the operation of circuit 100 may be beneficial in understanding the various embodiments of circuit 100. However, circuit 100 is not limited to the following examples.

In a first example, inverter 110 receives a logic 1 signal (e.g., Vpwr) and outputs a logic 0 (e.g., 0 volt) signal to level shifter 120 (via input 1210) and to level shifter 130 (via input 1320). Level shifter 120 outputs Vpwr via output 1240 (VBBOUT) and outputs Vbb via output 1250 (VBBOUTB). Similarly, level shifter 130 outputs Vneg via output 1340 (VNEGOUT) and outputs Vpwr via output 1350 (VNEGOUTB).

Vpwr at node 1410 turns ON pMOSFET 1420 and turns OFF nMOSFET 1430, which causes transmission gate 140 to output Vpwr at output 1440 (VNEGSEL). Vneg at node 1510 (VNEGOUT) turns OFF pMOSFET 1520 and turns ON nMOSFET 1530, which causes transmission gate 150 to output Vneg at output 1540 (VBBSEL).

Vpwr at the gate of switch 170 turns ON switch 170 and Vneg at the gate of switch 160 turns OFF switch 160. With switch 170 ON and switch 160 OFF, circuit 100 will output Vneg at output 180.

In a second example, inverter 110 receives a logic 0 signal (e.g., 0 volts) and outputs a logic 1 (e.g., Vpwr) signal to level shifter 120 (via input 1220) and to level shifter 130 (via input 1310). Level shifter 120 outputs Vbb via output 1240 (VBBOUT) and outputs Vpwr via output 1250 (VBBOUTB). Similarly, level shifter 130 outputs Vpwr via output 1340 (VNEGOUT) and outputs Vneg via output 1350 (VNEGOUTB).

Vbb at node 1410 turns OFF pMOSFET 1420 and turns ON nMOSFET 1430, which causes transmission gate 140 to output Vbb at output 1440 (VNEGSEL). Vpwr at node 1510 (VNEGOUT) turns ON pMOSFET 1520 and turns OFF nMOSFET 1530, which causes transmission gate 150 to output Vpwr at output 1540 (VBBSEL).

Vbb at the gate of switch 170 turns OFF switch 170 and Vpwr at the gate of switch 160 turns ON switch 160. With switch 170 OFF and switch 160 ON, circuit 100 will output Vbb at output 180.

In a third example where Vbb and Vneg are both zero volts, inverter 110 receives a logic 0 signal (e.g., Vpwr) and outputs a logic 1 (e.g., 0 volt) signal to level shifter 120 (via input 1210) and to level shifter 130 (via input 1320). Level shifter 120 outputs Vbb via output 1240 (VBBOUT) and outputs Vpwr via output 1250 (VBBOUTB). Similarly, level shifter 130 outputs Vpwr via output 1340 (VNEGOUT) and outputs Vneg via output 1350 (VNEGOUTB).

Vbb at node 1410 turns OFF pMOSFET 1420 and turns ON nMOSFET 1430, which causes transmission gate 140 to output Vbb at output 1440 (VNEGSEL). Vpwr at node 1510 (VNEGOUT) turns ON pMOSFET 1520 and turns OFF nMOSFET 1530, which causes transmission gate 150 to output Vpwr at output 1540 (VBBSEL).

Vbb at the gate of switch 170 turns OFF switch 170 and Vpwr at the gate of switch 160 turns ON switch 160. With switch 170 OFF and switch 160 ON, circuit 100 will output Vbb at output 180.

Though the various embodiments of circuit 100 have been discussed with reference to positive and negative voltages, circuit 100 is not limited to such. Specifically, the polarity of the input and output signals may be reversed. Furthermore, various embodiments contemplate the use of only positive or only negative voltages. As such, one skilled in the art will recognize that the polarity of the various MOSFET devices will dependent upon the polarity of the voltages utilized in any particular application of circuit 100.

Figure 2:
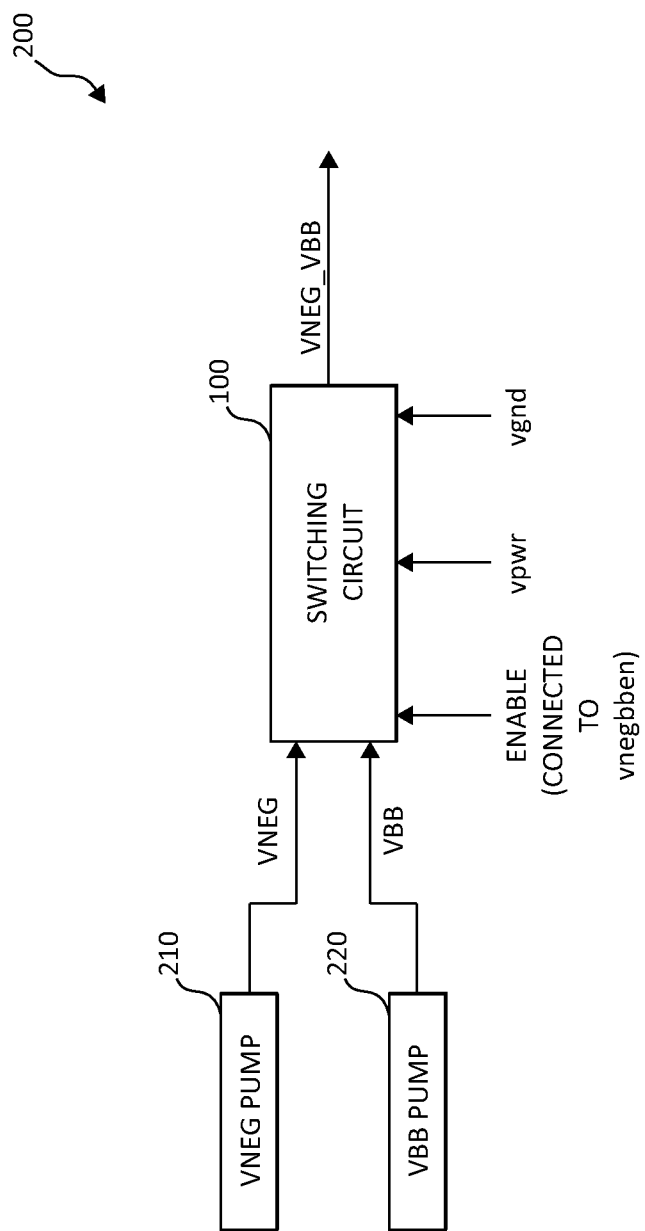
FIG. 2 is a block diagram of one embodiment of a system for switching between voltages.

FIG. 2 is a block diagram of one embodiment of a system 200 for switching between voltages. At least in the illustrated embodiment, system 200 comprises a VNEG pump 210 and a VBB pump 220 coupled to switching circuit 100 (see FIG. 1). VNEG pump 210 is configured to provide Vneg to switching circuit 100 and VBB pump 220 is configured to provide Vbb to switching circuit 100. Switching circuit 100, as discussed above, is to receive vnegbben for inverter 110 (see FIG. 1), Vpwr, Vgnd, Vneg, and Vbb and output the smaller of Vneg and Vbb at VNEG_VBB.

Figure 3:
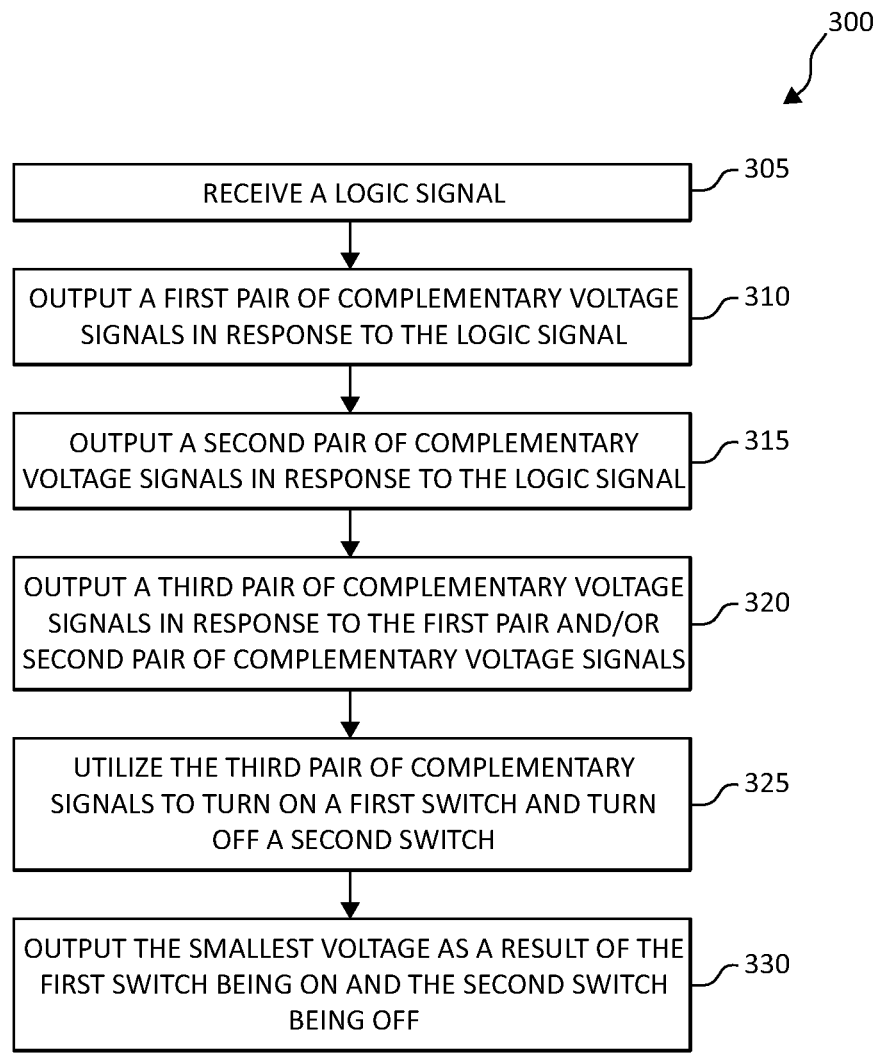
FIG. 3 is a flow diagram of one embodiment of a method for switching between voltages.

FIG. 3 is a flow diagram of one embodiment of a method 300 for switching between a plurality of voltages in a switching circuit (e.g., circuit 100). At least in the illustrated embodiment, method 300 begins by receiving a logic signal (e.g., a logic 0 or logic 1 signal) (block 305). The logic signal, in one embodiment, is received at a first level shifter (e.g., level shifter 120) and/or a second level shifter (e.g., level shifter 130) from an inverter (e.g., inverter 110) or may be a logic signal received from another device.

In response to receiving the logic signal, a first pair of complementary voltage signals is output (block 310) and/or a second pair of complementary voltage signals is output (block 315). In one embodiment, the first pair of complementary voltage signals includes a first negative voltage (e.g., Vbb) and a positive voltage (e.g., Vpwr) and/or the second pair of complementary voltage signals includes a second negative voltage (e.g., Vneg) and a positive voltage (Vpwr). For example, a first level shifter (e.g., level shifter 120) may output the first pair of complementary voltage signals and/or a second level shifter (e.g., level shifter 130) may output the second pair of complementary voltage signals.

Method 300 further comprises outputting a third pair of complementary voltage signals in response to receiving the first pair of complementary voltage signals and/or second pair of complementary voltage signals (block 320). In one embodiment, the third pair of complementary voltage signals includes a negative voltage (e.g., Vbb or Vneg) and the positive voltage (e.g., Vpwr). For example, a first transmission gate (e.g., transmission gate 140) may receive the first pair of complementary voltage signals and output the negative voltage and a second transmission gate (e.g., transmission gate 150) may receive the second pair of complementary voltage signals and output the positive voltage. In another example, the first transmission gate may receive the first pair of complementary voltage signals and output the positive voltage and the second transmission gate may receive the second pair of complementary voltage signals and output the negative voltage.

The third pair of complementary voltage signals is utilized to turn OFF a first switch and to turn ON a second switch (block 325), which results in outputting the smallest voltage (block 330). In one example, the positive voltage (e.g., Vpwr) is utilized to turn ON a first switch (e.g., switch 160) and the negative voltage (e.g., Vbb) is utilized to turn OFF a second switch (e.g., switch 170) to output Vbb. In another example, the positive voltage (e.g., Vpwr) is utilized to turn ON the second switch (e.g., switch 170) and the negative voltage (e.g., Vneg) is utilized to turn OFF the first switch (e.g., switch 160) to output Vneg. In this manner, the system (e.g., circuit 100) will output the smallest voltage (e.g., the smallest negative voltage).

Figure 4:
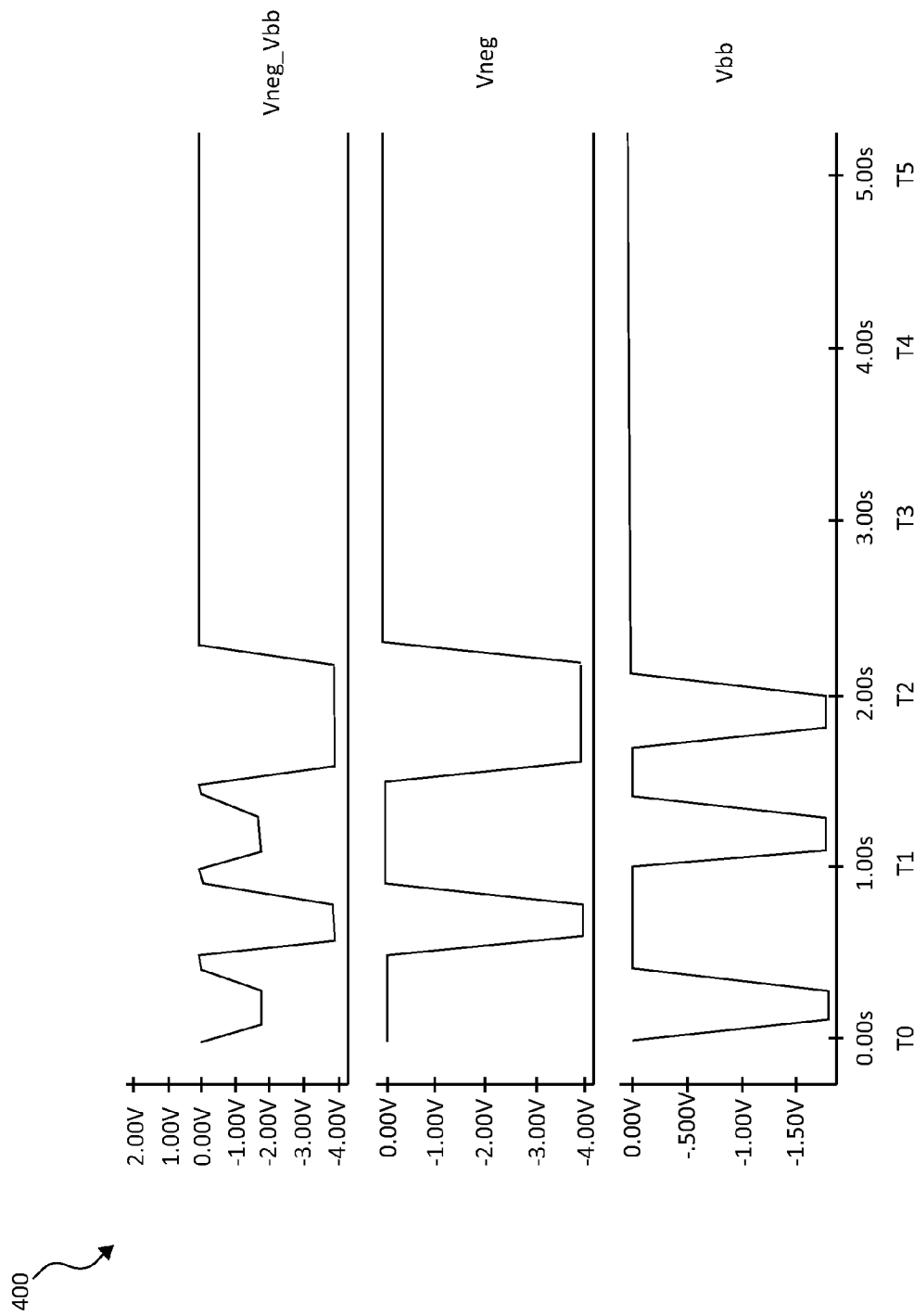
FIG. 4 is a timing diagram of one example of the operation of the system in FIG. 1.

Turning now to FIG. 4, FIG. 4 is a timing diagram 400 of one example of the operation of circuit 100. As shown in FIG. 4, the smallest voltage at any given time is output of circuit 100 (e.g., Vneg_Vbb).

In this example, at T0 Vneg is 0 volts and Vbb is zero volts so Vneg_Vbb is zero volts. In the interval from T0 to T1 (e.g., from 0 μs to 100 μs), Vneg remains at zero volts for a first portion of the interval, drops to −4.0 volts, and then returns to 0 volts. During the same interval, Vbb drops to −1.8 volts and then returns to zero volts for the remainder of the interval. As a result, the output (Vneg_Vbb) of circuit 100 over this interval decreases to −1.8 volts when Vbb is at −1.8 volts and Vneg is at 0 volts, increases 0 volts when Vneg and Vbb are both at 0 volts, decreases to −4.0 volts when Vneg decreases to −4.0 volts and Vbb is at 0 volts, and increases to 0 volts when Vneg and Vbb are both at 0 volts.

In the interval from T1 to T2 (e.g., from 100 μs to 200 μs), Vneg remains at zero volts for a first portion of the interval and drops to −4.0 volts for the remainder of the interval. Also during this interval, Vbb drops to −1.8 volts, increases to zero volts, and decreases to −1.8 volts for the remainder of the interval. As a result, the output (Vneg_Vbb) of circuit 100 over this interval decreases to −1.8 volts when Vbb is at −1.8 volts and Vneg is at 0 volts, increases 0 volts when Vneg and Vbb are both at 0 volts, decreases to −4.0 volts for the remainder of the interval when Vneg decreases to −4.0 volts and Vbb is at −1.8 volts.

In the interval from T2 to T3 (e.g., from 200 μs to 400 μs), Vneg remains at −4.0 volts for a first portion of the interval and increases to 0 volts for the remainder of the interval. Furthermore, Vbb remains at −1.8 volts for a portion of this interval and increases to zero volts for the remainder of the interval. As a result, the output (Vneg_Vbb) of circuit 100 over this interval remains at −4.0 volts when Vneg is at −4.0 volts and when Vbb is at −1.8 volts and at 0 volts. The output (Vneg_Vbb) increases to 0 volts when Vneg and Vbb are both at 0 volts for the remainder of this interval and remains at 0 volts for the subsequent intervals.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

As will be appreciated by one of ordinary skill in the art, aspects of the present invention may be embodied as an apparatus, system, or method. Accordingly, aspects of the present invention may take the form of an entirely hardware embodiment or an embodiment combining hardware and software aspects that may all generally be referred to herein as a "circuit," "module," or "system."

Aspects of the present invention are described above with reference to flowchart illustrations and/or block diagrams of methods, apparatus, and systems according to various embodiments. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a state machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer, other programmable data processing apparatus, or other devices to function in a particular manner, such that the instructions stored in the computer-readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the above figures illustrate the architecture, functionality, and operation of possible implementations of apparatus, systems, and methods according to various embodiments. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While one or more embodiments have been illustrated in detail, one of ordinary skill in the art will appreciate that modifications and adaptations to those embodiments may be made without departing from the scope of the various embodiments as set forth in the following claims.

What is claimed is:

1. A system for switching between a plurality of voltages, comprising:
   an output;
   a first switch coupled to the output;
   a second switch coupled to the output;
   a first controlled transmission gate coupled to the first switch and configured to be coupled to and receive a first negative voltage and a positive voltage from a first voltage source; and
   a second controlled transmission gate coupled to the second switch and configured to be coupled to and receive a second negative voltage and the positive voltage from a second voltage source.

2. The system of claim 1, wherein
   the first negative voltage comprises a program voltage and the second negative voltage comprises a biasing voltage.

3. The system of claim 2, wherein the first controlled transmission gate, the second controlled transmission gate, the first switch, and the second switch are configured to provide the smaller of the first negative voltage and the second negative voltage to the output.

4. The system of claim 3, wherein the first controlled transmission gate, the second controlled transmission gate, the first switch, and the second switch are configured to utilize the positive voltage to provide the smaller of the first negative voltage and the second negative voltage to the output.

5. The system of claim 1, further comprising:
   a first level shifter coupled between the first controlled transmission gate and the first voltage source; and
   a second level shifter coupled between the second controlled transmission gate and the second voltage source.

6. The system of claim 5, wherein:
   the first level shifter comprises a first voltage output and a second voltage output; and
   the first controlled transmission gate comprises:
      a first node coupled to the first voltage output,
      a second node coupled to the second switch,
      first P-channel metal oxide semiconductor field-effect transistor (pMOSFET) device comprising a first gate coupled to the first switch, a first source coupled to the first node, and a first drain coupled to the second node, and
      a first N-channel metal oxide semiconductor field-effect transistor (nMOSFET) device comprising a second gate coupled to the second voltage output, a second source coupled to the first node, and a second drain coupled to the second node.

7. The system of claim 6, wherein:
   the second level shifter comprises a third voltage output and a fourth voltage output; and
   the second controlled transmission gate comprises:
      a third node coupled to the third voltage output,
      a fourth node coupled to the first switch,
      a second pMOSFET device comprising a third gate coupled to the second switch, a third source coupled to the third node, and a third drain coupled to the fourth node, and
      a second nMOSFET device comprising a fourth gate coupled to the fourth voltage output, a fourth source coupled to the third node, and a fourth drain coupled to the fourth node.

8. The system of claim 7, wherein:
   the first switch is a third nMOSFET device comprising a fifth gate coupled to the fourth node, a fifth source coupled to the output, and a fifth drain coupled to the first gate; and
   the second switch is a fourth nMOSFET device comprising a sixth gate coupled to the second node, a sixth source coupled to the output, and a sixth drain coupled to the third gate.

9. The system of claim 8, wherein:
the first pMOSFET device and the second pMOSFET device are high voltage pMOSFET devices; and
the first nMOSFET device, the second nMOSFET device, the third nMOSFET device, and the fourth nMOSFET device are high voltage nMOSFET devices.

10. The system of claim 7, wherein:
the first voltage output and the second voltage output are complements of each other; and
the third voltage output and the fourth voltage output are complements of each other.

11. The system of claim 10, wherein:
the first level shifter comprises a first negative voltage input and a first logical input; and
the second level shifter comprises a second negative voltage input and a second logical input.

12. The system of claim 8, wherein:
the first level shifter is configured to provide, via the first voltage output, a first negative voltage to the first node and provide, via the second voltage output, a positive voltage to the second gate in response to receiving a logic 1 input;
the first level shifter is configured to provide, via the first voltage output, the positive voltage to the first node and provide, via the second voltage output, the first negative voltage to the second gate in response to receiving a logic 0 input;
the second level shifter is configured to provide, via the third voltage output, the positive voltage to the third node and provide, via the fourth voltage output, a second negative voltage to the fourth gate in response to receiving a logic 1 input; and
the second level shifter is configured to provide, via the third voltage output, a second negative voltage to the third node and provide, via the fourth voltage output, the positive voltage to the fourth gate in response to receiving a logic 0 input.

13. The system of claim 12, further comprising:
an inverter coupled to the first level shifter and the second level shifter; and
a third voltage source configured to provide the positive voltage, the third voltage source coupled to the first level shifter and the second level shifter.

14. An apparatus for switching between a plurality of voltages, comprising:
a first level shifter configured to output a first pair complementary voltages;
a second level shifter configured to output a second pair complementary voltages;
a first transmission gate coupled to the first level shifter and configured to receive the first pair of complementary voltages and output a first voltage;
a second transmission gate coupled to the second level shifter and configured to receive the second pair of complementary voltages and output a second voltage, wherein the first voltage and the second voltage comprise a third pair of complementary voltages.

15. The apparatus of claim 14, wherein:
the first transmission gate comprises:
a first input node configured to receive one of the first pair complementary voltages,
a first output node,
a first P-channel metal oxide semiconductor field-effect transistor (pMOSFET) device comprising a first gate, a first source coupled to the first input node, and a first drain coupled to the first output node, and
a first N-channel metal oxide semiconductor field-effect transistor (nMOSFET) device comprising a second gate configured to receive the other one of the first pair complementary voltages, a second source coupled to the first input node, and a second drain coupled to the first output node; and
the second transmission gate comprises:
a second input node configured to receive one of the second pair complementary voltages,
a second output node,
a second pMOSFET device comprising a third gate configured to receive the other one of the first pair complementary voltages, a third source coupled to the second input node, and a third drain coupled to the second output node, and
a second nMOSFET device comprising a fourth gate configured to receive the other one of the second pair complementary voltages, a fourth source coupled to the second input node, and a fourth drain coupled to the second output node, wherein the first gate is configured to receive the other one of the second pair complementary voltages.

16. The apparatus of claim 15, wherein:
the first pair of complementary voltages comprises a first negative voltage and a positive voltage;
the second pair of complementary voltages comprises a second negative voltage and the positive voltage; and
the third pair of complementary voltages comprises a third negative voltage and the positive voltage.

17. The apparatus of claim 16, wherein:
the positive voltage is between 1.6 volts and 1.95 volts, inclusive;
the first negative voltage is between −4.5 volts and −3.0 volts, inclusive;
the second negative voltage is between −2.2 volts and −1.0 volts, inclusive; and
the third negative voltage is one of the first negative voltage and the second negative voltage.

18. A method for switching between a plurality of voltages, comprising:
receiving, at a first transmission gate, a first pair of complementary voltages;
receiving, at a second transmission gate, a second pair of complementary voltages;
selecting a smallest voltage amongst both pairs of complementary voltages; and
outputting a third pair of complementary voltages comprising the smallest voltage.

19. The method of claim 18, wherein:
receiving the first pair of complementary voltages comprises receiving a first negative voltage and a positive voltage;
receiving the second pair of complementary voltages comprises receiving a second negative voltage and the positive voltage;
selecting the smallest voltage comprises selecting the smaller of the first negative voltage and the second negative voltage; and
outputting the third pair of complementary voltages comprises outputting the positive voltage and one of the first negative voltage and the second negative voltage.

20. The method of claim 19, further comprising:
receiving, at a first switch, the outputted positive voltage;
receiving, at a second switch, the outputted one of the first negative voltage and the second negative voltage; and
outputting the one of the first negative voltage and the second negative voltage.

* * * * *